United States Patent
Gu et al.

(10) Patent No.: US 10,818,255 B2
(45) Date of Patent: Oct. 27, 2020

(54) SHIFT REGISTER CIRCUIT AND DRIVING METHOD THEREOF, GATE DRIVER ON ARRAY CIRCUIT, AND TOUCH SENSING DISPLAY PANEL

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Honggang Gu, Beijing (CN); Junsheng Chen, Beijing (CN); Xianjie Shao, Beijing (CN); Jie Song, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 408 days.

(21) Appl. No.: 15/761,342

(22) PCT Filed: Apr. 13, 2017

(86) PCT No.: PCT/CN2017/080431
§ 371 (c)(1),
(2) Date: Mar. 19, 2018

(87) PCT Pub. No.: WO2018/188020
PCT Pub. Date: Oct. 18, 2018

(65) Prior Publication Data
US 2020/0243032 A1    Jul. 30, 2020

(51) Int. Cl.
G09G 3/36 (2006.01)
G06F 3/041 (2006.01)
G11C 19/28 (2006.01)

(52) U.S. Cl.
CPC ....... *G09G 3/3674* (2013.01); *G06F 3/04166* (2019.05); *G11C 19/28* (2013.01); *G09G 2310/0286* (2013.01); *G09G 2310/08* (2013.01)

(58) Field of Classification Search
None
See application file for complete search history.

(56) References Cited

U.S. PATENT DOCUMENTS

2008/0048712 A1 *   2/2008  Ahn ..................... H03K 17/161
                                                           326/21
2014/0056399 A1 *   2/2014  Shang .................... G11C 19/28
                                                           377/68
(Continued)

FOREIGN PATENT DOCUMENTS

CN          104575429 A        4/2015
CN          105185343 A       12/2015
(Continued)

OTHER PUBLICATIONS

International Search Report & Written Opinion dated Jan. 12, 2018, regarding PCT/CN2017/080431.

*Primary Examiner* — Dorothy Harris
(74) *Attorney, Agent, or Firm* — Intellectual Valley Law, P.C.

(57) ABSTRACT

A shift register circuit including a switch control port configured to couple to a pull-up node via two transistors in series controlled by another transistor. The switch control port is configured to keep at a low voltage level during a display scan stage for the shift register circuit to output a gate scanning signal via an output port to a gate line which optionally still transmit a touch scanning signal, to switch to a high voltage level to halt the gate scanning signal while transmitting the touch scanning signal only in the gate line during a touch scan stage within the display scan stage, and
(Continued)

to switch back to the low voltage level after the touch scan stage to output the gate scanning signal without coupling interference of the touch scanning signal. The shift register circuit is compatible for driving either 60 Hz or high-frequency (>60 Hz) Full-in-cell touch sensing display panel.

20 Claims, 6 Drawing Sheets

(56) References Cited

U.S. PATENT DOCUMENTS

| | | | |
|---|---|---|---|
| 2014/0079173 A1* | 3/2014 | Yan | G11C 19/28 377/64 |
| 2016/0225336 A1* | 8/2016 | Gu | G11C 19/28 |
| 2016/0335962 A1* | 11/2016 | Xiao | G09G 3/3677 |
| 2017/0108989 A1 | 4/2017 | Gu et al. | |
| 2018/0107329 A1* | 4/2018 | Gu | G09G 3/20 |

FOREIGN PATENT DOCUMENTS

| | | |
|---|---|---|
| CN | 105513522 A | 4/2016 |
| CN | 105679229 A | 6/2016 |
| CN | 105679262 A | 6/2016 |
| CN | 106531052 A | 3/2017 |
| KR | 20140086192 A | 7/2014 |

\* cited by examiner

SHIFT REGISTER CIRCUIT AND DRIVING METHOD THEREOF, GATE DRIVER ON ARRAY CIRCUIT, AND TOUCH SENSING DISPLAY PANEL

CROSS-REFERENCE TO RELATED APPLICATION

This application is a national stage application under 35 U.S.C. § 371 of International Application No. PCT/CN2017/080431, filed Apr. 13, 2017, the contents of which are incorporated by reference in the entirety.

TECHNICAL FIELD

The present invention relates to a field of display technology, more particularly to a shift register circuit, a gate driver on array circuit, a touch sensing display panel, and a method of driving a shift register circuit.

BACKGROUND

Thin-film transistor based liquid-crystal display (TFT-based LCD) is one of many types of display apparatus widely used in recent years. A development trend is to make the LCD display with a higher resolution and a narrower border width for the display panel. One way to achieve that is to form a gate driver circuit directly on the display panel. In addition, more and more input tools and devices such as a mouse, a key button, a touch plate, a joystick are replaced by touch panels. Because of its ease of use characteristics, multi-functions in operation, declining prices, and steadily improved yield, the touch panel becomes more and more popular. Touch panel includes a plug-in type and an embedded type. The plug-in type is to place a plate having touch sensing functions in front of a display panel so that its touch surface covers all the visual area of the display for achieving touch sensing control. The embedded type is to integrate the touch sensing function on the display panel and attach (or not attach) a cover glass from outside. User can touch the cover glass (or directly the touch panel) to perform the touch operations. The embedded type includes an In-cell touch panel and On-cell touch panel. On-cell type is formed by disposing the touch sensor on the outer side of the LCD display panel and then attach a polarizer and a protection cover glass on the touch sensor. In-cell type, and particularly Hybrid In-cell or Full-in-cell touch panel usually is formed by placing the touch sensor at the outer side of thin-film transistor (TFT) glass or at the inner side between the TFT glass and color-filter layer for providing touch sensing functions.

TFT-based LCD driver includes data driver and gate driver. A gate driver circuit can be set in a display panel in a Chip-on-Flex (COF) or Chip-on-Glass (COG) package. Alternatively, the gate driver circuit can be formed within the display panel by integrating a plurality of thin-film transistors IC units. For example, the gate driver circuit is a shift register circuit having one output port connected to one gate line. By inputting a gate scanning signal from the shift register circuit to each gate line progressively, pixels of entire display panel can be scanned row by row. Unlike conventional COF or COG design, a gate driver on array (GOA) circuit formed by cascading a plurality of shift register circuits in series can substantially reduce manufacture costs of the liquid crystal display panel by eliminating one or more fabricating processes, and increase productivity. In order to achieve higher resolution and narrower border width for the LCD display panel, one of most important solution is to directly integrate the GOA circuit on the display panel.

SUMMARY

In one aspect, the present invention provides a shift register circuit configured to be cascaded into a gate driver on array (GOA) circuit for driving a touch sensing display panel, the shift register circuit comprising a first transistor having a gate coupled to an input port to receive an input signal for controlling a VDD supply voltage being passed from a source of the first transistor to a pull-up node coupled to a drain of the first transistor; a second transistor having a gate coupled to a reset port to receive a reset signal for controlling a VSS supply voltage being passed from a source of the second transistor to the pull-up node coupled to a drain of the second transistor; a third transistor having a gate coupled to the pull-up node and a first electrode of a first capacitor, a source connected to a first clock input port, and a drain coupled commonly to a second electrode of the first capacitor and an output port for outputting a gate scanning signal to a gate line; a fourth transistor and a fifth transistor having a common drain connected to the output port and a common source provided with a low voltage level, the fourth transistor having a gate coupled to a switch control port, the fifth transistor having a gate connected to a pull-down node; a sixth transistor having a drain connected to the pull-down node and a source provided with the low voltage level and a gate connected to the pull-up node; a seventh transistor having a drain connected to the pull-up node and a source provided with the low voltage level and a gate connected to the pull-down node; an eighth transistor having a gate connected to the pull-up node and a source connected to the switch control port; a ninth transistor and a tenth transistor having a common gate coupled to a drain of the eighth transistor, the ninth transistor having a source connected to the switch control port and a drain connected to a source of the tenth transistor having a drain connected to the pull-up node; and an eleventh transistor having a gate and source commonly connected to a second clock input port and a drain connected to the pull-down node and a first electrode of a second capacitor with a second electrode connected to the first clock input port; wherein the switch control port receives a switch signal provided with a high voltage level for halting the gate scanning signal from the output port to the gate line; and a touch scanning signal transmitted during a touch scan stage within a display scan stage is substantially free of coupling interference from any gate scanning signal.

Optionally, the shift register circuit is in an n-th unit of the GOA circuit comprising N numbers of units cascaded in series for respectively outputting N numbers of gate scanning signals to respective N numbers of gate lines of a display panel sequentially in an order from n=1 through n=N, wherein $1 \leq n \leq N$, wherein the input port of the n-th unit receives an input signal from an output port of the (n−1)-th unit, the reset port of the n-th unit receives a reset signal from the output port of the (n+1)-th unit of the GOA circuit, the output port of the n-th unit connects to an n-th gate line of the N numbers of gate lines, the input port of the first unit receives a start signal from a power supply and the reset port of the N-th unit receives an external RESET signal.

Optionally, the first clock input port and the second clock input port respectively input a first clock signal and a second clock signal, each of the first clock signal and a second clock signal being provided with a high voltage level and a low voltage level alternatively in a plurality of periods during the display scan stage per gate line, wherein the first clock signal and the second clock signal have an opposite phase in each of the plurality of periods.

Optionally, the display scan stage comprises a first period during which the first clock signal is provided with a low voltage level, the input signal is provided with a high voltage level from an output of the (n−1)-th unit, the switch signal is provided with a low voltage level, the pull-up node is pulled to a high voltage level and the pull-down node is pushed to a low voltage level; a second period during which the switch signal is kept at the low voltage level, the ninth transistor and the tenth transistor is in an OFF state, the first clock signal is provided with a high voltage level, the pull-up node is bootstrapped via the first capacitor to a level higher than the high voltage level, the pull-down node remains at the low voltage level, the output port outputs the gate scanning signal at the high voltage level to the n-th gate line, and a third period during which the reset signal is provided with a high voltage level from an output of the (n+1)-th unit to pill down the pull-up node to a low voltage level to turn off the third transistor coupled to the output port to cut off the gate scanning signal.

Optionally, the display scan stage further comprises a fourth period during which the second clock signal is provided with a high voltage level to pass the high voltage level to the pull-down node to turn on the fifth transistor for releasing noises of the output port and turn on the seventh transistor for releasing noises of the pull-up node, the pull-up node remains at the low voltage level to keep the sixth transistor in an OFF state, the output port outputs a low voltage level, wherein the fourth period is substantially overlapped in time with the third period.

Optionally, the display scan stage further comprises a fifth period during which the first clock signal is provided with a high voltage level to keep the pull-down node to the high voltage level via the second capacitor and to keep the fifth transistor and the seventh transistor in an ON state for releasing noises of the output port and the pull-up node, wherein the fifth period follows the fourth period in time, the fourth period and the fifth period alternatingly repeated until the display scan stage ends.

Optionally, the display scan stage comprises a touch scan stage having a touch period inserted behind the first period, during which the switch signal is provided with a high voltage level to turn on the fourth transistor for releasing noises of the output port and halting the gate scanning signal from the output port to the n-th gate line to eliminate coupling interference to a touch scanning signal transmitted nearby, the first clock signal and the second clock signal are kept at a low voltage level, the pull-up node remains at the high voltage level to turn the ninth transistor and tenth transistor in an ON state to allow the high voltage level of the switch signal to continue charging the first capacitor and maintain the pull-up node at the high voltage level, wherein the touch period is at least partially overlapped in time with the second period.

Optionally, the input port associated with the VDD supply voltage and the reset port associated with the VSS supply voltage are interchanged.

Optionally, the shift register circuit is in an n-th unit of the GOA circuit comprising N numbers of units cascaded in series for respectively outputting N numbers of gate scanning signals to respective N numbers of gate lines of a display panel sequentially in an order from n=N through n=1, wherein 1≤n≤N, wherein the input port of the n-th unit receives an input signal from an output port of the (n+1)-th unit, the reset port of the n-th unit receives a reset signal from the output port of the (n−1)-th unit of the GOA circuit, the output port of the n-th unit connects to an n-th gate line of the N numbers of gate lines, the input port of the N-th unit receives a start signal from a power supply and the reset port of the first unit receives an external RESET signal.

In another aspect, the present invention provides a GOA circuit comprising N numbers of shift register units cascaded in series, each of the N numbers of shift register units comprises a shift register circuit described herein.

In another aspect, the present invention provides a touch sensing display panel comprising a GOA circuit described herein for driving N numbers of gate lines in an array substrate including a plurality of pixel electrodes integrated with a layer of a plurality of touch sensors in an In-cell package.

Optionally, the GOA circuit is configured to output respective gate scanning signals to drive the N numbers of gate-lines on the array substrate with the switch signal being provided with a low voltage level for each shift register unit, while the plurality of touch sensors are configured to transmit touch scanning signals nearby.

Optionally, the GOA circuit is configured to output respective gate scanning signals to drive the N numbers of gate-lines on the array substrate with the switch signal being provided with a low voltage level during a display scan stage before and after a touch scan stage, and to halt the gate scanning signals into respective N numbers of gate lines with the switch signal being switched from a low voltage level to a high voltage level for each shift register unit only during the touch scan stage while the plurality of touch sensors are configured to transmit touch scanning signals nearby.

In another aspect, the present invention provides a method of driving a shift register circuit described herein as a unit of a GOA circuit for generating a plurality of gate scanning signals to a plurality of gate lines, the method comprising providing the switch signal at a low voltage level to the switch control port for outputting a gate scanning signal from the output port to one gate line of the plurality of gate lines during a display scan stage for image display.

Optionally, during the display scan stage for image display, the method further comprises, in a first period, inputting a high voltage level through the input port to turn on the first transistor to allow the VDD supply voltage to charge the first capacitor and pull up the pull-up node to a high voltage level under a condition that a low voltage level is provided to the first clock input port and the switch signal is provided with a low voltage level, wherein the high voltage level at the pull-up node pulls down the pull-down node to a low voltage level by turning on the sixth transistor with a source being provided with the low voltage level, the low voltage level at the pull-down node turns off the fifth transistor and the seventh transistor; in a second period, keeping the switch signal at the low voltage level to maintain the ninth transistor and the tenth transistor in an OFF state and providing the first clock signal with a high voltage level for bootstrapping the pull-up node via the first capacitor to a voltage level higher than the high voltage level to keep the sixth transistor in an ON state and to output the high voltage level of the first clock signal as a gate scanning signal to the gate line; and in a third period, providing the reset signal with a high voltage level to pull down the pull-up node to the low voltage level to turn off the third transistor coupled to the output port to halt the gate scanning signal.

Optionally, the method further comprises, in a fourth period, inputting the second clock signal at a high voltage level to pass the high voltage level to the pull-down node to turn on the fifth transistor for releasing noises of the output port and turn on the seventh transistor for releasing noises of the pull-up node, the output port is set to a low voltage level, wherein the fourth period is substantially overlapped in time with the third period.

Optionally, the method further comprises, in a fifth period, providing the first clock signal with the high voltage level to keep the pull-down node at the high voltage level via the second capacitor to keep the fifth transistor and the seventh transistor in an ON state for releasing noises of the output port and the pull-up node, wherein the fifth period follows the fourth period in time, the fourth period and the fifth period alternatingly repeated until the display scan stage ends.

Optionally, the method further comprises switching the switch signal to a high voltage level to halt output of the gate scanning signal only during a touch scan stage for touch sensing in a middle of the display scan stage; and switching the switch signal back to the low voltage level to resume the display scan stage for outputting the gate scanning signal to the one gate line.

Optionally, dining a display scan stage mixed with a touch scan stage comprising a touch period for transmitting the touch scanning signal near the one gate line, the method further comprising in a first period, inputting a high voltage level through the input port to turn on the first transistor to allow the VDD supply voltage to charge the first capacitor and pull up the pull-up node to a high voltage level under a condition that the first clock signal is provided with a low voltage level and the switch signal is provided with a low voltage level, wherein the high voltage level at the pull-up node pulls down the pull-down node to a low voltage level by turning on the sixth transistor with a source provided with a low voltage level, the low voltage level at the pull-down node turns off the fifth transistor and the seventh transistor; in the touch period, switching the switch signal to a high voltage level to turn on the fourth transistor for releasing noises of the output port and halting the gate scanning signal with the first clock signal being kept at the low voltage level, wherein the pull-up node remains at the high voltage level to turn the ninth transistor and tenth transistor in an ON state to allow the high voltage level of the switch signal to continue charging the first capacitor and maintain the pull-up node at the high voltage level; and in a second period, switching the switch signal back to the low voltage level for rest of the display scan stage, providing the first clock signal with a high voltage level for bootstrapping the pull-up node via the first capacitor to a voltage level higher than the high voltage level to keep the sixth transistor in an ON state, and outputting the high voltage level of the first clock signal as the gate scanning signal into the gate line, wherein the switch signal at the low voltage level turns the ninth transistor and the tenth transistor to an OFF state, the pull-down node remains at the low voltage level to keep the fifth transistor and seventh transistor in an OFF state; wherein the touch period follows behind the first period in time and is at least partially overlapped with the second period.

Optionally, the method further comprises, in a third period, providing the reset signal with a high voltage level to pull down the pull-up node to a low voltage level to turn off the third transistor coupled to the output port to cut off the gate scanning signal; and in a fourth period, inputting the second clock signal at a high voltage level to pass the high voltage level to the pull-down node to turn the fifth transistor in an ON state for releasing noise of the output port and turn the seventh transistor in an ON state for releasing noise of the pull-up node, the output port is set to a low voltage level, wherein the fourth period is substantially overlapped in time with the third period.

Optionally, the method further comprises, in a fifth period, providing the first clock signal at a high voltage level to keep the pull-down node at a high voltage level via the second capacitor to keep the fifth transistor and the seventh transistor in an ON state for releasing noises of the output port and the pull-up node, wherein the fifth period follows the fourth period in time; and alternatingly repeating the fourth period and the fifth period further until the display scan stage ends.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now describe more specifically with reference to the following embodiments. It is to be noted that the following descriptions of some embodiments are presented herein for purpose of illustration and description only. It is not intended to be exhaustive or to be limited to the precise form disclosed.

Figure 1:
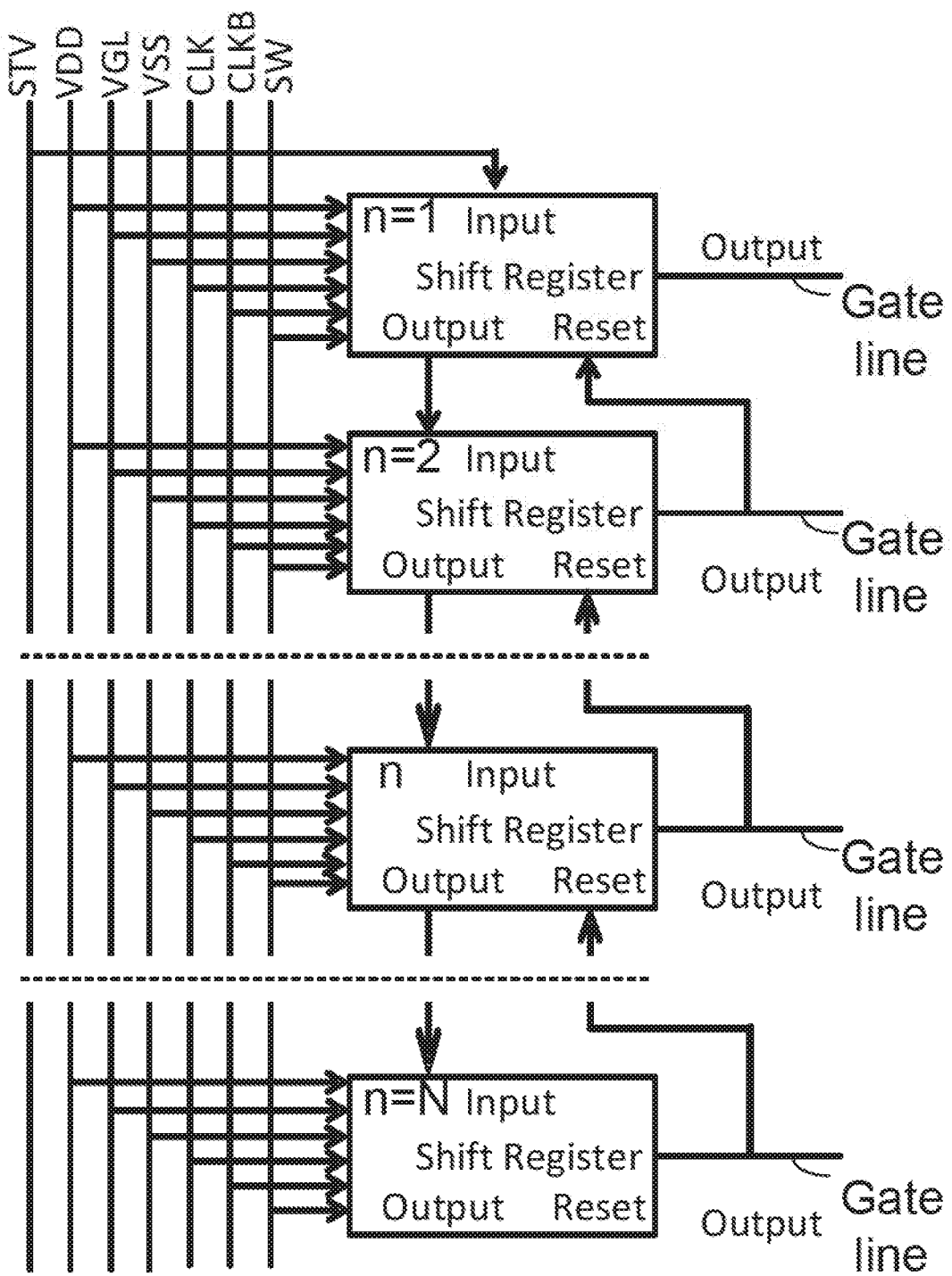
FIG. 1 is a schematic diagram of a gate driver on array (GOA) circuit formed by cascading multiple shift register units according to an embodiment of the present disclosure.

The present disclosure provides, inter alia, a shift register circuit and driving method thereof, a gate driver on array circuit, and a touch sensing display panel that substantially obviate one or more of the problems due to limitations and disadvantages of the related art. In one aspect, the present disclosure provides a gate driver on army (GOA) circuit for driving touch sensing display panel including an array substrate having a plurality of pixel electrodes integrated with a layer of a plurality of touch sensors. FIG. 1 is a schematic diagram of a gate driver on array (GOA) circuit formed by cascading multiple shift register units according to an embodiment of the present disclosure. Referring to FIG. 1, the GOA circuit is formed by cascading N numbers of shift register units in series, sequentially from n=1 unit through n=N unit, for providing N numbers of driving signals to respective N numbers of gate lines formed on the array substrate. N is a positive integer, e.g., N=1080. Each gate line is coupled to a plurality of gate electrodes of respective thin-film transistors for controlling a row of pixel electrodes. Each shift register unit is configured to output a driving signal, or so called gate scanning signal, to the gate line to control ON or OFF state of the thin-film transistors for control charging the row of pixel electrodes for image display. For the N number of gate lines, the gate scanning signals are provided in sequential order to display a frame of image within a display time period. For each gate line, the gate scanning signal is applied within a display scan stage.

Referring to FIG. 1, the GOA circuit is provided with multiple supply voltages VDD, VSS, and VGL, clock signals CLK and CLKB, and control signals including a start signal STV, an external reset signal RESET, and particularly a switch signal SW. VDD and VSS are typical IC high/low supply voltages. VGL is a fixed supply voltage at a low voltage level. Clock signals CLK and CLKB are two complementary high/low voltage signals provided in opposite phase in alternative periods. Switch signal SW, namely, is a control signal switched between high and low voltage levels for controlling circuit mode exchange. The GOA circuit is formed by cascading N shift register units in such a way that each n-th shift register unit has an Output port for outputting a gate scanning signal to a gate line, an Input port receiving an input signal from an Output port of a previous adjacent (n−1)-th shift register unit, a Reset port receiving a reset signal from an Output port of a next adjacent (n+1)-th shift register unit, and additionally receives some common signals: supply voltages VDD, VSS, and VGL, clock signals CLK and CLKB, and switch signal SW.

In some embodiments, the present disclosure provides a design of the shift register circuit that aims to reduce signal coupling interference in Full-in-cell touch sensing display panel and support bidirectional-scanning operation. In typical Full-in-cell touch sensing display panel, the touch sensing is achieved via each touch sensor to receive and transmit a touch scanning signal scanned through at least a portion of the display panel that is involved the touch operation. As the layer of the plurality of touch sensors is integrated closely, especially for the Full-in-cell design, with the array substrate containing an array of the plurality of pixel electrodes, the touch scanning signal will be easily interfered by coupling with the gate scanning signals through the gate lines nearby. The coupling interference between the gate scanning signal and the touch scanning signal causes problems to the touch sensing functions and affects image quality. It is a major aspect of the present disclosure to provide a shift register circuit for generating a gate scanning signal during the display scan stage that can be effectively halted so that the gate scanning signal is not outputted into a gate line when a touch scan stage starts for transmitting a touch scanning signal near the gate line. The output of the gate scanning signal is resumed after the touch scan stage ends to continue the display scan stage. As the touch scanning signal is transmitted, no gate scanning signal is transmitted nearby, thus the coupling interference between them is substantially eliminated.

Figure 2:
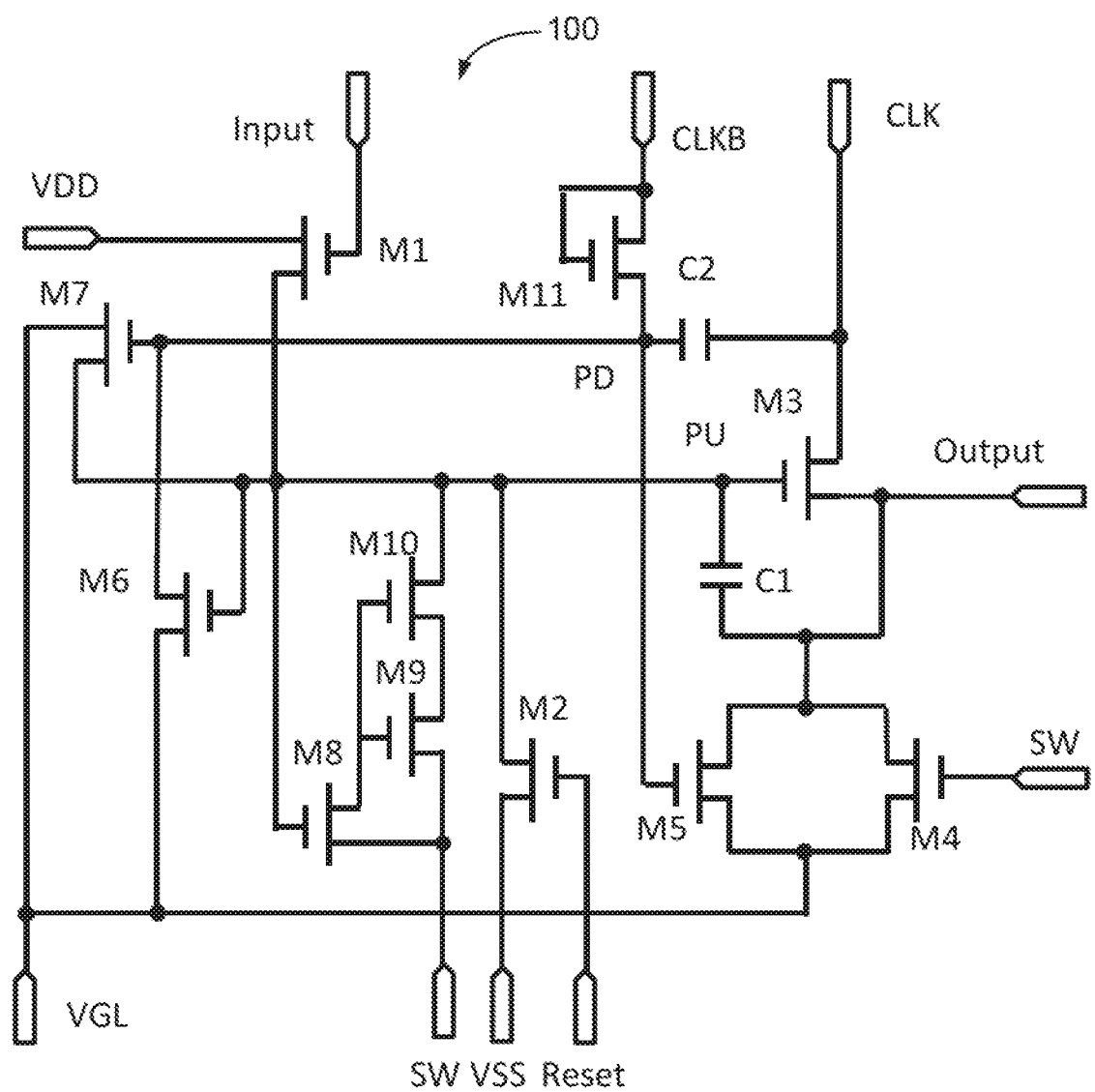
FIG. 2 is a circuit diagram of a shift register circuit in the GOA configured to perform gate scanning in forward order according to an embodiment of the present disclosure.

FIG. 2 is a circuit diagram of a shift register circuit in the GOA configured to perform gate scanning in forward direction according to an embodiment of the present disclosure. Referring to FIG. 2, the shift register circuit 100 is a circuit having multiple transistors configured with multiple input ports or output ports to receive respective input/reset signals and the multiple common signals as mentioned above as a unit of GOA circuit (see FIG. 1). In particular, the shift register circuit 100 includes a first transistor M1 having a gate coupled to an Input port and being configured to control a VDD supply voltage to pass from a source of the first transistor M1 to a pull-up node PU coupled to a drain of the first transistor M1. In a substantially symmetric configuration, the shift register circuit 100 includes a second transistor M2 having a gate coupled to a Reset port and being configured to control a VSS supply voltage to pass from a source of the second transistor M2 to the pull-up node PU coupled to a drain of the second transistor M2. This symmetric circuitry configuration of the Input port associated with the VDD supply voltage and the Reset port associated with the VSS supply voltage allows the two sections of the circuit to be interchanged for adopting a GOA with a reversed scanning operation. More details will be described regarding a bidirectional-scanning function of a GOA circuit cascaded with multiple shift register units of a same kind each having the shift register circuit 100.

Referring to FIG. 2, the shift register circuit 100 also includes a third transistor M3 having a gate coupled to the pull-up node PU and a first electrode of a first capacitor C1, a source coupled to a first clock input port for receiving a first clock signal CLK, and a drain coupled to a second electrode of the first capacitor C1 and an Output port. The first capacitor C1 is being charged when the pull-up node PU is provided with a high voltage level and the Output is at a low voltage level. Additionally, the shift register circuit 100 includes a fourth transistor M4 and a fifth transistor M5 having a common drain connected to the Output port and a common source provided with a low voltage level of a fixed supply voltage VGL. The fourth transistor M4 has a gate coupled to a switch control port to receive a switch signal SW. The fifth transistor M5 has a gate connected to a pull-down node PD. The first clock signal CLK is a source for controlling the Output port to output a gate scanning signal determined in time (set by the first clock signal CLK and the second clock signal CLKB) by a potential level at the pull-up node PU that controls ON or OFF state of the third transistor M3 and by a charge level in the first capacitor C1. The fourth transistor M4 and the fifth transistor M5, respectively controlled by the switch signal SW and a potential level at the pull-down node PD, provide additional control over the output of the gate scanning signal, particularly, releasing noises of the Output port when the Output port is at a low voltage level during certain periods of each display scan stage.

Referring to FIG. 2, the shift register circuit 100 further includes a sixth transistor M6 having a drain connected to the pull-down node PD and a source provided with the low voltage level VGL and a gate connected to the pull-up node PU, and a seventh transistor M7 having a drain connected to the pull-up node PU and a source provided with the low voltage level VGL and a gate connected to the pull-down node PD. M6 and M7 are set for controlling the potential levels at the pull-up node PU and the pull-down node PD during different periods of each display scan stage.

Referring to FIG. 2 again, the shift register circuit 100 includes an eighth transistor M8 having a gate connected to the pull-up node PU, a source connected to the switch control port provided with the switch signal SW, and a drain coupled to a common gate of a ninth transistor M9 and a tenth transistor M10. The ninth transistor M9 is coupled to the tenth transistor M10 in series such that a drain of the ninth transistor M9 connects to a source of the tenth transistor M10. A source of M9 is coupled to the switch control port and a drain of M10 is coupled the pull-up node PU. This section of circuit, including the eighth transistor M8, the ninth transistor M9, and the tenth transistor M10, prevents charge leaking at the pull-up node PU during a touch scan stage inserted in the display scan stage, during which the output of the gate scanning signal is halted. By coupling the pull-up node PU via this section of circuit under a condition that the switch signal at a high voltage level is provided at the switch control port, the potential level at the pull-up node PU can be maintained at a high voltage level until the touch scan stage ends so that the Output port can resume to output the gate scanning signal at the desired high voltage level to the gate line in a resumed display scan stage.

Referring to FIG. 2, lastly, the shift register circuit 100 includes an eleventh transistor M11 having a gate and source commonly connected to a second clock input port for receiving a second clock signal CLKB. The eleventh transistor M11 has a drain connected to the pull-down node PD and a first electrode of a second capacitor C2. A second electrode of the second capacitor C2 is connected to the first clock input port provided with the first clock signal CLK.

In some embodiments, the shift register circuit 100 is configured to use the switch signal SW for switching between a display scan mode for providing the gate scanning signal for image display only and a mixed display-touch scan mode for halting the gate scanning signal only during a touch scan stage and outputting the gate scanning signal or releasing noises of the Output port in periods of the display scan stage outside the touch scan stage. Optionally, the circuitry of the shift register circuit 100 is configured to release noises of the Output port as well as the pull-up node PU during the periods when no gate scanning signal is outputted by controlling the Output port at a fixed low voltage level. Optionally, the circuitry of the shift register circuit 100 provides a mechanism for reducing coupling effect between the switch signal SW and the pull-up node PU so that the a high voltage level provided with the switch signal SW can continue charging the first capacitor C1 during the touch scan stage to compensate the possible leaking through paths of M6 or M7, thereby enhancing the reliability of the shift register circuit 100 to output a signal at a high voltage level to the gate line as needed as a gate scanning signal.

In another aspect, the present disclosure provides a touch sensing display panel comprising a GOA circuit of FIG. 1 which is formed by cascading N numbers of shift register units each having a shift register circuit 100 of FIG. 2 for driving N numbers of gate lines in an array substrate including a plurality of pixel electrodes integrated with a layer of a plurality of touch sensors in a panel package. Optionally, the shift register circuit 100 is configured to provide conventional GOA functions and 60 Hz Full-in-cell GOA functions to drive the touch sensing display panel. In this option, there is no intentional separation of outputting the gate scanning signal or transmitting any touch scanning signal. The gate scanning signal is outputted from the shift register circuit 100 for driving the charging of a plurality of pixel electrodes in each row of the array substrate during any display scan stage. At the same time, the touch signal may be allowed to transmit to some of the plurality of touch sensors whenever there is a touch sensing operation. Of course, there is a possibility that the touch scanning signal is affected by the coupling interference from the gate scanning signal. Optionally, the same shift register circuit 100 is configured to provide 60 Hz Full-in-cell GOA functions and High-frequency Full-in-cell GOA functions to drive the touch sensing display panel. In this option, the gate scanning signal is outputted from the shift register circuit 100 during a period of a display scan stage. When a touch sensing operation is initiated, a touch scan stage is inserted into the display scan stage. At this time, the shift register circuit 100 is configured, by switching the switch signal to a high voltage level, to halt the output of the gate scanning signal and allow a touch scanning signal to be transmitted to or from some of the plurality of touch sensors without the coupling interference of the gate scanning signal. When the touch scan stage ends, the display scan stage of the shift register circuit 100 is resumed to output the gate scanning signal to the gate line in normal way for driving image display.

In some embodiments, the GOA circuit is configured to operate in a time-division driving mode. The time-division driving mode includes a display scan mode and a touch scan mode. In the display scan mode, the GOA circuit is configured to output respective gate scanning signals to drive the N numbers of gate-lines on the array substrate with the switch signal being provided with a low voltage level. In the touch scan mode, a touch sensor (e.g., a touch electrode layer) is configured to transmit touch scanning signals, and the GOA circuit is configured to halt the output of the gate scanning signals into respective N numbers of gate lines while the touch sensor is transmitting touch scanning signals nearby, with the switch signal being switched from a low voltage level to a high voltage level for each shift register unit.

Optionally, the panel package of the touch sensing display panel is a conventional COF or COG package with a plug-in touch panel. The shift register circuit 100 is compatible to provide all GOA functions required for driving the array substrate for regular display while the gate scanning signals give almost no coupling interference to the touch signal. Optionally, the panel package is an On-cell package which expects the shift register circuit 100 only operates in one mode for providing the gate scanning signal to a gate line without much coupling interference between the gate scanning signal and touch signals as they are separated by one or more thick insulation layers. Optionally, the panel package is an In-Cell package such that the gate lines coupled to the pixel electrodes are very close to signal lines for transmitting touch scanning signals. Therefore, the same shift register circuit 100 is configured to operate in the mixed display-touch scan mode by simply switching the switch signal from the low voltage level to the high voltage level to achieve its function of eliminating coupling interference between the gate scanning signal and the touch scanning signal.

Figure 3:
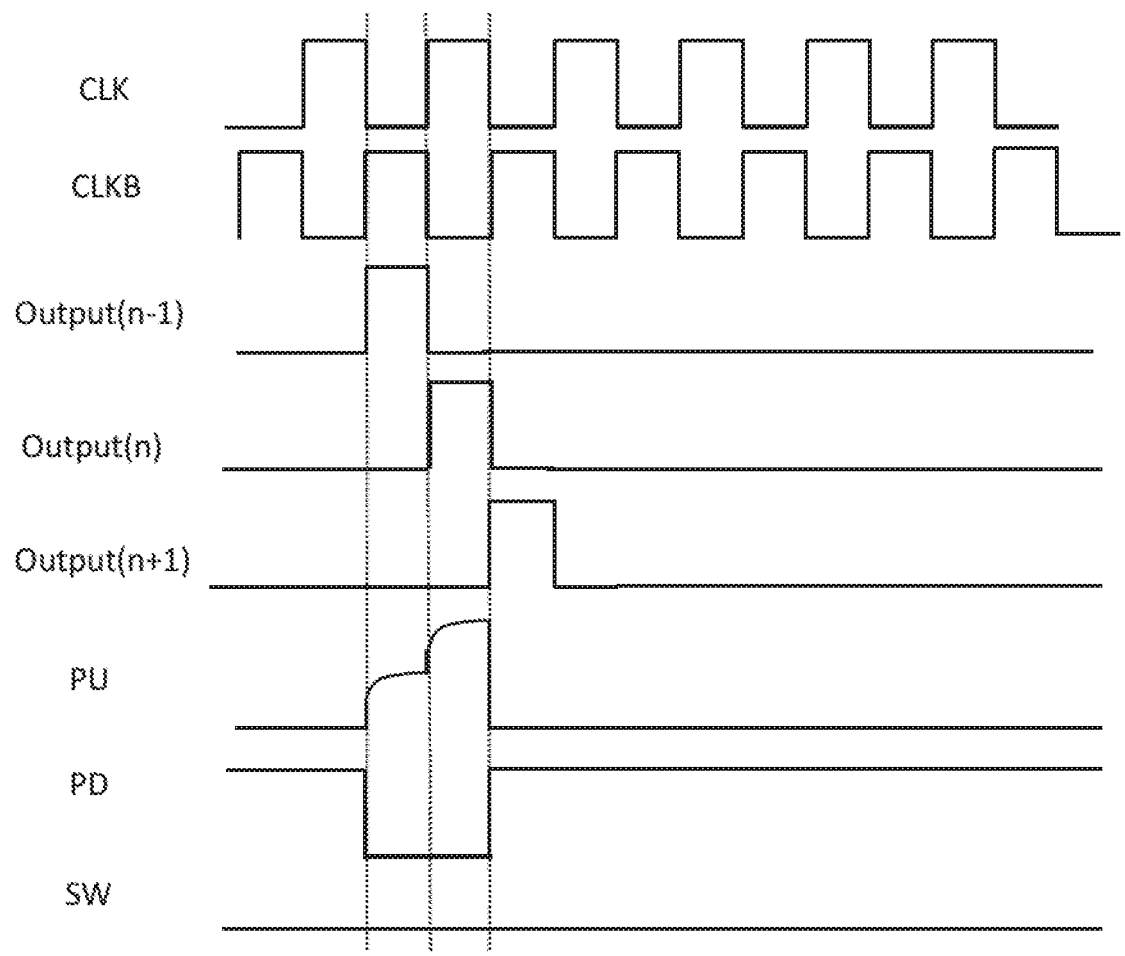
FIG. 3 is a timing diagram of operating the shift register circuit of FIG. 2 in a display scan stage according to an embodiment of the present disclosure.

In another aspect, the present disclosure provides a method of driving a shift register circuit of FIG. 2 as a unit being cascaded into a GOA circuit of FIG. 1. The GOA circuit, as described above, is configured to generate a plurality of gate scanning signals to a plurality of gate lines to control charging of a plurality of pixel electrodes (not shown) of an array substrate integrating a layer of a plurality of touch sensors (not shown). FIG. 3 is a timing diagram of operating the shift register circuit of FIG. 2 in a display scan stage according to an embodiment of the present disclosure. As pointed out earlier, the method of driving a shift register circuit includes operating the shift register circuit to provide a gate scanning signal to a gate line for control charging a row of pixel electrodes in a display scan stage based on a low voltage level provided with the switch signal. Referring to FIG. 3, the first clock signal CLK and the second clock CLKB are respectively provided with a high voltage level and a low voltage level alternatively in a plurality of periods during the display scan stage per gate line. CLK and CLKB have an opposite phase in each of the plurality of periods. The display scan stage, based on its functional operation, can be divided into multiple periods as following:

In a first period, the method includes inputting a high voltage level through the Input port to turn on the first transistor M1, thereby allowing the VDD supply voltage to pass to the pull-up node PU to charge the first capacitor C1 (while the Output port is at a low voltage level). The potential level at the pull-up node PU is pulled up to a high voltage level under a condition that the first clock input port receives the first clock signal CLK at a low voltage level. The high voltage level at the pull-up node PU pulls down the pull-down node PD to a low voltage level by turning on the sixth transistor M6 with its source being provided with a low voltage level VGL. The low voltage level at the pull-down node PD turns off the fifth transistor M5 and the seventh transistor M7 to ensure no leaking through these paths and a stable output can be achieved.

In a second period, the method includes keeping the switch signal SW at a low voltage level throughout the display scan stage to maintain the ninth transistor M9 and the tenth transistor M10 in an OFF state, cutting off the coupling of the SW signal and the pull-up node PU. The method also includes providing the first clock signal CLK with a high voltage level. As the first capacitor C1 is fully charged and the potential level at the source of the third transistor M3 is high, the charges in the first capacitor C1 bootstraps the pull-up node PU to pull up its potential level higher than the high voltage level. Therefore, the high potential level at the pull-up node PU keeps the sixth transistor M6 in an ON state and makes the third transistor M3 ON for outputting a signal at a high voltage level from the first clock input port as a gate scanning signal through the Output port to the gate line.

In a third period, the method includes providing a reset signal with a high voltage level, which is an output signal from a next adjacent shift register unit, to pull down the pull-up node PU to a low voltage level. The low voltage level at PU turns off the third transistor M3 coupled to the Output port to halt the gate scanning signal. The third period is merely a necessary period to end the second period to complete one output of one gate scanning signal during one display scan stage from the Output port. Each shift register unit in the GOA circuit, of course, is configured to provide a plurality of gate scanning signals respectively at a plurality of display scan stages to complete a whole display time period for displaying a frame of image.

Additionally, in a fourth period, the method includes inputting the second clock signal CLKB at a high voltage level to the second clock input port, which turns on the eleventh transistor M11 to pass the high voltage level (of the CLKB from the source of M11) to a drain node connected to the pull-down node PD. The high voltage level at the pull-down node PD turns the fifth transistor M5 to an ON state for setting the Output port to a low voltage level provided by the supply voltage VGL, resulting in release of noises of the Output port. At the same time, the high voltage level at PD also turns on the seventh transistor M7 for setting the pull-up node PU to the low voltage level VGL and releasing noises of the pull-up node PU. Functionally, the fourth period is another period other than the third period. Physically, the fourth period is substantially overlapped in time with the third period, during which the second clock signal CLKB is at a high voltage level and the first clock signal CLK is at a low voltage level with an opposite phase relative to the CLKB. Both the third and fourth periods are associated with the Output port at a low voltage level, i.e., no output of a gate scanning signal. Thus, the method described above of setting the Output port at the fixed low supply voltage VGL is important to release noises of the Output port during the periods when no gate scanning signal is outputted, ensure output stability of the shift register unit.

Moreover, in a fifth period, the method includes providing the first clock signal CLK with a high voltage level to keep the pull-down node PD at a high voltage level via the second capacitor C2. The high voltage level at the pull-down node PD keeps the fifth transistor M5 and the seventh transistor M7 in an ON state which respectively set the Output port and the pull-up node PU to the low voltage level VGL. This continues, like the fourth period, to release noises of the Output port and the pull-up node PU. Physically, the fifth period follows the fourth period in time. The fourth period and the fifth period are alternatingly repeated over time until the display scan stage ends. Thus, within each display scan stage, for any period outside the period of outputting the gate scanning signal, if there is no output of the gate scanning signal at the Output port, the shift register circuit is configured to ensure that noises at the Output port and the PU node will be continuously released to enhance output stability.

The method described above is performed by operating the shift register circuit of FIG. 2 based on setting the switch signal at a low voltage level. The shift register circuit is compatible with conventional GOA function for driving a display panel and 60 Hz Full-in-cell GOA function for driving a touch sensing display panel without intention to separate touch scanning signal sent to the touch sensors for touch control from the gate scanning signal for image display.

Figure 4:
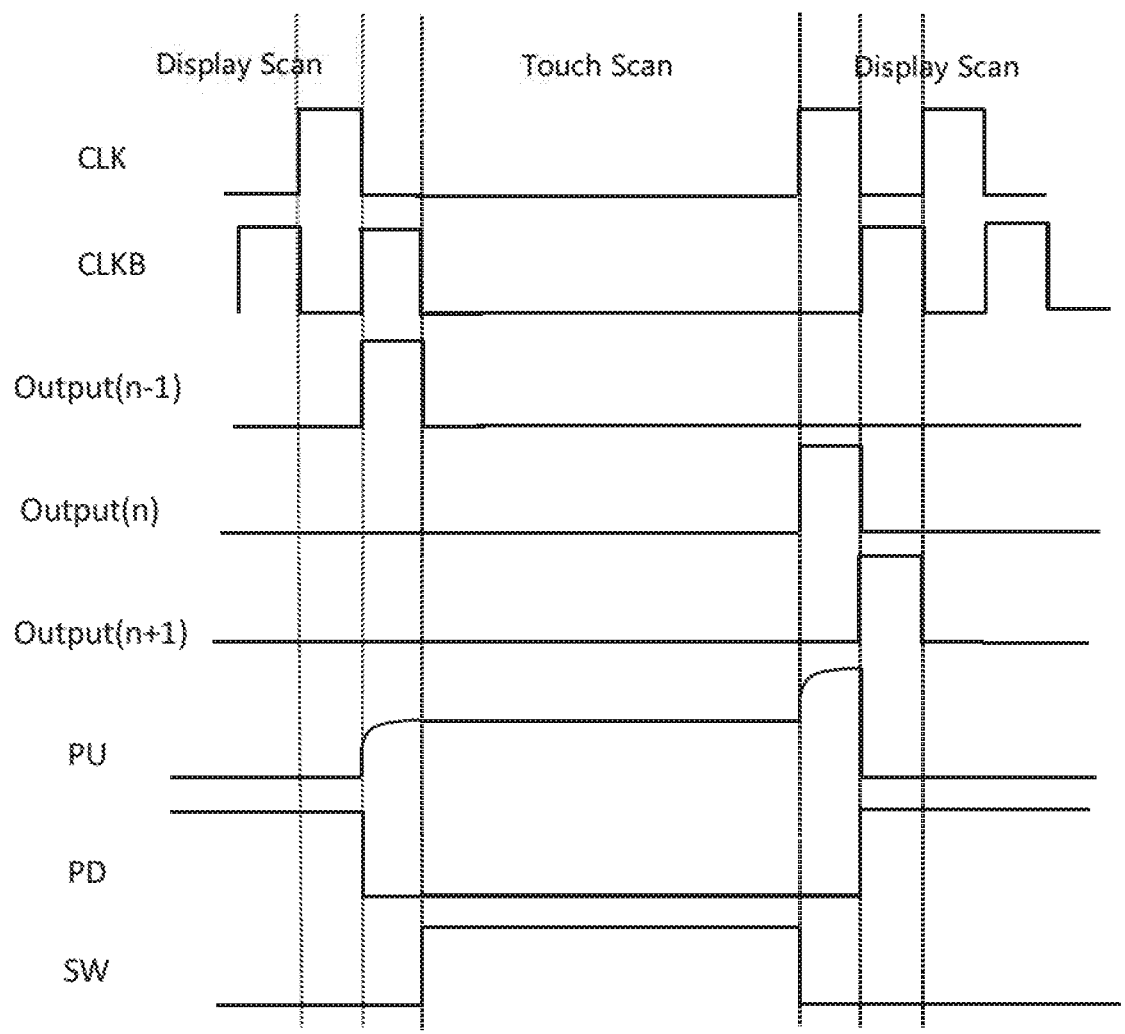
FIG. 4 is a timing diagram of operating the shift register circuit of FIG. 2 in a display scan stage including a touch scan stage according to an embodiment of the present disclosure.

In some embodiments, the method can be performed by operating the shift register circuit of FIG. 2 in a mixed display-touch mode based on switching the switch signal to a high voltage level to halt the output of the gate scanning signal as a touch scan stage starts within a display scan stage and switching back to the low voltage level again to resume output of the gate scanning signal after the touch scan stage ends and the display scan stage continues. FIG. 4 is a timing diagram of operating the shift register circuit of FIG. 2 in a display scan stage including a touch scan stage according to an embodiment of the present disclosure. In terms of the timing diagram of FIG. 4 and referring to the shift register circuit of FIG. 2, the method for driving the shift register circuit in the mixed display-touch mode includes, in a first period of a display scan stage, inputting a high voltage level through the Input port to turn on the first transistor M1 to allow the VDD supply voltage to charge the first capacitor C1 and pull up the pull-up node PU to a high voltage level under a condition that a first clock signal CLK at a low voltage level is provided to the first clock input port. The high voltage level at the pull-up node PU pulls down the pull-down node PD to a low voltage level by turning on the sixth transistor M6 with a source being provided with a fixed low voltage level VGL. The low voltage level at the pull-down node PD turns off the fifth transistor M5 and the seventh transistor M7 to cut off the possible leaking path of the Output port prepared for outputting the gate scanning signal. In this period, the switch signal SW is kept at a low voltage level which controls the fourth transistor M4 to an OFF state.

Around this time, a touch scan stage is initiated to introduce a touch period, the method includes switching the switch signal SW from the low voltage level to a high voltage level to turn on the fourth transistor M4 for setting the Output potential to the low voltage level VGL, releasing noises of the Output port and halting the gate scanning signal from the Output port into the gate line. The pull-up node PU remains at the high voltage level pulled up during the first period, especially for the GOA is operated at High-Frequency Full-in-cell mode. The first clock signal stays low in the touch period to ensure the Output port is at the low voltage level. The high voltage level at PU node turns on the eighth transistor M8 which passes the switch signal SW at the high voltage level to the common gate of the ninth transistor M9 and tenth transistor M10 to turn them ON. The ninth transistor M9 and the tenth transistor M10 are connected in series and in an ON state to allow the high voltage level of the switch signal SW to continue charging the first capacitor C1 during the touch period when the output of the gate scanning signal is halted. Additionally, for the High-Frequency GOA operation, the pull-up node PU is retained (or stored) at a high voltage level until the touch period ends, which keeps the shift register circuit to stay in position for continuing to output the gate scanning signal for display when the display scan stage resumes. The switch signal SW also remains at the high voltage level until the touch period ends. Then the switch signal SW is switched back to the low voltage level as the display scan stage resumes.

Figure 5:
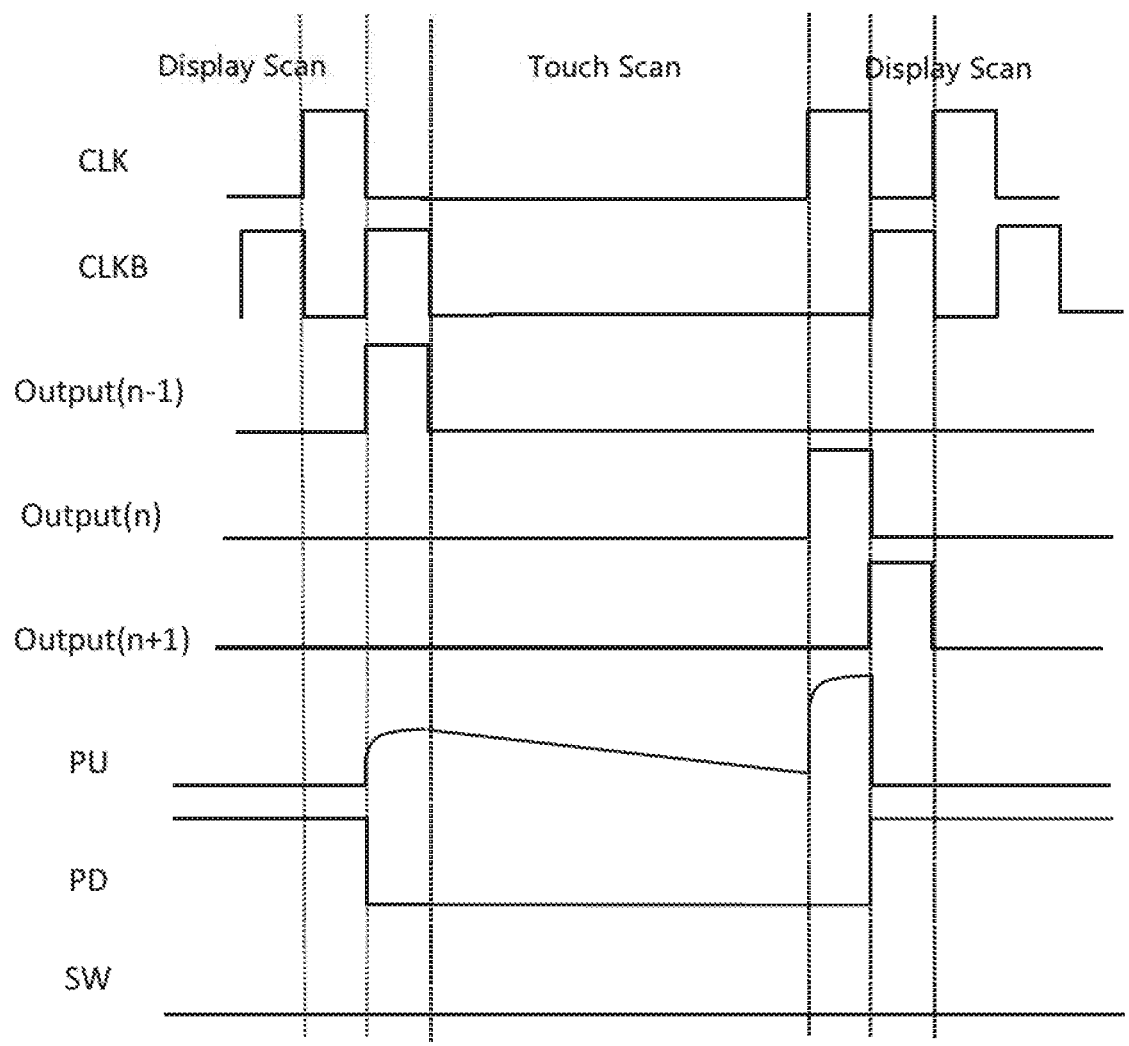
FIG. 5 is a timing diagram of operating the shift register circuit with improper coupling between a switch control port and a pull-up node according to an embodiment of the present disclosure.

In a specific embodiment, the shift register circuit 100 of FIG. 2 includes a section of switch control circuitry having a configuration of the eighth transistor M8 gated by the PU node to connect the switch control port to common gate of the ninth transistor M9 and the tenth transistor M10 for couple with the PU node again. This unique section provides a function of continuing charing the first capacitor C1 during the touch scan stage when the output of the gate scanning signal is halted. This is to ensure the the pull-node PU to be kept at a high voltage level. In an alternative design of a shift register circuit without this section, no charging to the first capacitor C1 occurs. Because of possible leakage through the second transistor M2 and the seventh transistor M7, the potential level of the pull-up node PU will gradually decay, as shown in FIG. 5, which is a timing diagram of operating the shift register circuit with improper coupling between a switch control port and a pull-up node according to an embodiment of the present disclosure. Therefore, when the touch scan stage ends, the shift register circuit may have no output from the Output port as the potential level at the pull-up node PU becomes too low or only output a signal at a voltage level below the expected level for the gate scanning signal.

Further, the touch period ends and a second period of the display scan stage resumes, the method includes providing the first clock signal CLK at a high voltage level for bootstrapping the pull-up node PU via the first capacitor C1 to a voltage level higher than the high voltage level. The high voltage level at PU keeps the sixth transistor M6 in an ON state to pass the low voltage level VGL to the pull-down node PD. The low voltage level at PD will continue to keep the fifth transistor M5 and the seventh transistor M7 in an OFF state to ensure no back-door leakage. Additionally, the high voltage level at PU turn on the third transistor M3 to allow a high voltage level signal passed from the first clock signal CLK to the Output port as the gate scanning signal into the gate line. In the same second period after the touch scan stage ends, the switch signal SW is switched back to the low voltage level to turn the ninth transistor M9 and the tenth transistor M10 to an OFF state to block any coupling of lowered potential level at the switch control port. Optionally, the touch period follows behind the first period in time and is at least partially overlapped with the second period.

Furthermore, the display scan stage enters a third period, the method further includes providing the reset signal with a high voltage level (from an output of a next adjacent shift register circuit in the same series of the GOA circuit) to pull down potential level of the pull-up node PU to a low voltage level associated with VSS supply voltage to turn off the third transistor M3. This effectively cut off the gate scanning signal outputted from the Output port. In a fourth period, the method further includes inputting the second clock signal CLKB at a high voltage level to turn on the eleventh transistor M11 to pass the high voltage level (of the same clock signal CLKB) to the pull-down node PD. The high voltage level at PD turns on the fifth transistor M5 for releasing noises of the Output port and turn on the seventh transistor M7 for releasing noises of the pull-up node PU. In this period, the Output port is set to a low voltage level. Functionally, the fourth period is another period other than the third period. Physically, the fourth period is substantially overlapped in time with the third period, during which the second clock signal CLKB is at a high voltage level and the first clock signal CLK is at a low voltage level with an opposite phase relative to the CLKB. Both the third and fourth periods are associated with the Output port at low voltage level, i.e., no output of a gate scanning signal. Thus, the method described above of setting the Output port at a fixed low supply voltage VGL is important to release noises of the Output port during the periods when no gate scanning signal is outputted, ensure output stability of the shift register unit.

Moreover, the method includes providing the first clock signal at a high voltage level to keep the pull-down node PD at a high voltage level via the second capacitor C2 to keep the fifth transistor M5 and the seventh transistor M7 in an ON state for continuing release of noises of the Output port and the pull-up node PU. The fifth period follows the fourth period in time. The method further includes alternatingly repeating the fourth period and the fifth period one or more cycles until the display scan stage ends. In all the periods after outputting the gate scanning signal, the shift register circuit is configured to release noises of the Output port and the pull-up node PU to ensure output stability of the shift register unit and the GOA circuit as well.

Figure 6:
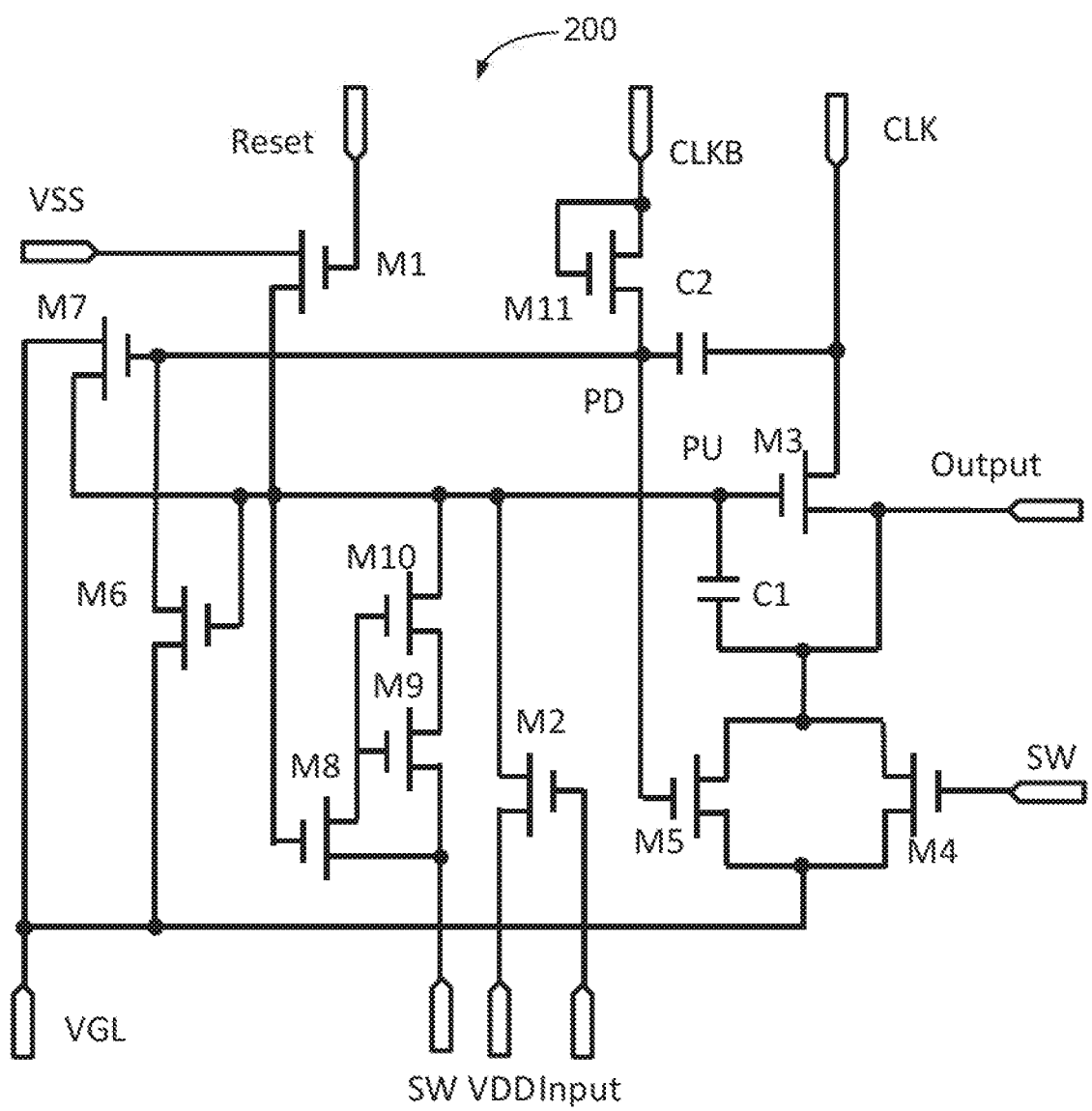
FIG. 6 is a circuit diagram of a shift register circuit in the GOA configured to perform gate scanning in backward order according to an embodiment of the present disclosure.

In an alternative embodiment, the shift register circuit design according to the present disclosure, as shown in FIG. 2, is configured to support bidirectional-scanning function of the GOA for driving the display. FIG. 6 is a circuit diagram of a shift register circuit in the GOA configured to perform gate scanning in backward order according to an embodiment of the present disclosure. Referring to FIG. 2 and FIG. 6, both the shift register circuit 100 and the shift register circuit 200 have substantially the same circuitry configuration except that the Input port associated with the VDD supply voltage in the shift register circuit 100 is interchanged with the Reset port associated with the VSS supply voltage in the shift register circuit 200.

Optionally, the shift register circuit 100 is used as an n-th unit being cascaded into a GOA circuit which respectively outputting N numbers of gate scanning signals to respective N numbers of gate lines of a display panel sequentially in an order from n=1 through n=N, wherein 1≤n≤N. In the GOA circuit, the Input port of the n-th unit receives an input signal from an Output port of the (n−1)-th unit, the reset port of the n-th unit receives a reset signal from the Output port of the (n+1)-th unit of the GOA circuit, the Output port of the n-th unit connects to an n-th gate line of the N numbers of gate lines, the Input port of the first unit receives a start signal STV from a power supply and the reset port of the N-th unit receives an external RESET signal. In each time period for displaying a frame of image, the GOA is operated to scan all the N numbers of gate lines in forward direction from 1 to N.

Optionally, the shift register circuit 200 is used as an n-th unit being cascaded into a GOA circuit which respectively outputting N numbers of gate scanning signals to respective N numbers of gate lines of a display panel sequentially in an order from n=N through n=1, wherein 1≤n≤N. In the GOA, the Input port of the n-th unit receives an input signal from an Output port of the (n+1)-th unit, the reset port of the n-th unit receives a reset signal from the Output port of the (n−1)-th unit of the GOA circuit, the Output port of the n-th unit connects to an n-th gate line of the N numbers of gate lines, the Input port of the N-th unit receives a start signal STV from a power supply and the reset port of the first unit receives an external RESET signal. In each time period for displaying a frame of image, the GOA is operated to scan all the N numbers of gate lines in backward direction from N to 1.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A shift register circuit configured to be cascaded into a gate driver on array (GOA) circuit for driving a touch sensing display panel, the shift register circuit comprising:
    a first transistor having a gate coupled to an input port to receive an input signal for controlling a VDD supply voltage being passed from a source of the first transistor to a pull-up node coupled to a drain of the first transistor;
    a second transistor having a gate coupled to a reset port to receive a reset signal for controlling a VSS supply voltage being passed from a source of the second transistor to the pull-up node coupled to a drain of the second transistor;
    a third transistor having a gate coupled to the pull-up node and a first electrode of a first capacitor, a source connected to a first clock input port, and a drain coupled commonly to a second electrode of the first capacitor and an output port for outputting a gate scanning signal to a gate line;
    a fourth transistor and a fifth transistor having a common drain connected to the output port and a common source provided with a low voltage level, the fourth transistor having a gate coupled to a switch control port, the fifth transistor having a gate connected to a pull-down node;
    a sixth transistor having a drain connected to the pull-down node and a source provided with the low voltage level and a gate connected to the pull-up node;
    a seventh transistor having a drain connected to the pull-up node and a source provided with the low voltage level and a gate connected to the pull-down node;
    an eighth transistor having a gate connected to the pull-up node and a source connected to the switch control port;
    a ninth transistor and a tenth transistor having a common gate coupled to a drain of the eighth transistor, the ninth transistor having a source connected to the switch control port and a drain connected to a source of the tenth transistor having a drain connected to the pull-up node; and
    an eleventh transistor having a gate and source commonly connected to a second clock input port and a drain connected to the pull-down node and a first electrode of a second capacitor with a second electrode connected to the first clock input port;
    wherein the switch control port receives a switch signal provided with a high voltage level for halting the gate scanning signal from the output port to the gate line; and
    a touch scanning signal transmitted during a touch scan stage within a display scan stage is substantially free of coupling interference from any gate scanning signal.

2. The shift register circuit of claim 1, wherein the shift register circuit is in an n-th unit of the GOA circuit comprising N numbers of units cascaded in series for respectively outputting N numbers of gate scanning signals to respective N numbers of gate lines of a display panel sequentially in an order from n=1 through n=N, wherein 1≤n≤N, wherein the input port of the n-th unit receives an input signal from an output port of the (n−1)-th unit, the reset port of the n-th unit receives a reset signal from the output port of the (n+1)-th unit of the GOA circuit, the output port of the n-th unit connects to an n-th gate line of the N numbers of gate lines, the input port of the first unit receives a start signal from a power supply and the reset port of the N-th unit receives an external RESET signal.

3. The shift register circuit of claim 2, wherein the first clock input port and the second clock input port respectively input a first clock signal and a second clock signal, each of the first clock signal and a second clock being provided with a high voltage level and a low voltage level alternatively in a plurality of periods during the display scan stage per gate line, wherein the first clock signal and the second clock signal have an opposite phase in each of the plurality of periods.

4. The shift register circuit of claim 3, wherein the display scan stage comprises:
    a first period during which the first clock signal is provided with a low voltage level, the input signal is provided with a high voltage level from an output of the (n−1)-th unit, the switch signal is provided with a low voltage level, the pull-up node is pulled to a high voltage level and the pull-down node is pushed to a low voltage level;

a second period during which the switch signal is kept at the low voltage level, the ninth transistor and the tenth transistor is in an OFF state, the first clock signal is provided with a high voltage level, the pull-up node is bootstrapped via the first capacitor to a level higher than the high voltage level, the pull-down node remains at the low voltage level, the output port outputs the gate scanning signal at the high voltage level to the n-th gate line; and a third period during which the reset signal is provided with a high voltage level from an output of the (n+1)-th unit to pull down the pull-up node to a low voltage level to turn off the third transistor coupled to the output port to cut off the gate scanning signal.

5. The shift register circuit of claim 4, wherein the display scan stage further comprises:

a fourth period during which the second clock signal is provided with a high voltage level to pass the high voltage level to the pull-down node to turn on the fifth transistor for releasing noises of the output port and turn on the seventh transistor for releasing noises of the pull-up node, the pull-up node remains at the low voltage level to keep the sixth transistor in an OFF state, the output port outputs a low voltage level, wherein the fourth period is substantially overlapped in time with the third period.

6. The shift register circuit of claim 5 wherein the display scan stage further comprises:

a fifth period during which the first clock signal is provided with a high voltage level to keep the pull-down node to the high voltage level via the second capacitor and to keep the fifth transistor and the seventh transistor in an ON state for releasing noises of the output port and the pull-up node, wherein the fifth period follows the fourth period in time, the fourth period and the fifth period alternatingly repeated until the display scan stage ends.

7. The shift register circuit of claim 4, wherein the display scan stage comprises a touch scan stage having a touch period inserted behind the first period, during which the switch signal is provided with a high voltage level to turn on the fourth transistor for releasing noises of the output port and halting the gate scanning signal from the output port to the n-th gate line to eliminate coupling interference to a touch scanning signal transmitted nearby, the first clock signal and the second clock signal are kept at a low voltage level, the pull-up node remains at the high voltage level to turn the ninth transistor and tenth transistor in an ON state to allow the high voltage level of the switch signal to continue charging the first capacitor and maintain the pull-up node at the high voltage level, wherein the touch period is at least partially overlapped in time with the second period.

8. The shift register circuit of claim 1, wherein the input port associated with the VDD supply voltage and the reset port associated with the VSS supply voltage are interchanged.

9. The shift register circuit of claim 8, wherein the shift register circuit is in an n-th unit of the GOA circuit comprising N numbers of units cascaded in series for respectively outputting N numbers of gate scanning signals to respective N numbers of gate lines of a display panel sequentially in an order from n=N through n=1, wherein 1≤n≤N, wherein the input port of the n-th unit receives an input signal from an output port of the (n+1)-th unit, the reset port of the n-th unit receives a reset signal from the output port of the (n−1)-th unit of the GOA circuit, the output port of the n-th unit connects to an n-th gate line of the N numbers of gate lines, the input port of the N-th unit receives a start signal from a power supply and the reset port of the first unit receives an external RESET signal.

10. A gate driver on array (GOA) circuit comprising N numbers of shift register units cascaded in series, each of the N numbers of shift register units comprises a shift register circuit of claim 1.

11. A touch sensing display panel comprising a GOA circuit of claim 10 for driving N numbers of gate lines in an array substrate including a plurality of pixel electrodes integrated with a layer of a plurality of touch sensors in an In-cell package.

12. The touch sensing display panel of claim 11, wherein the GOA circuit is configured to output respective gate scanning signals to drive the N numbers of gate-lines on the array substrate with the switch signal being provided with a low voltage level for each shift register unit, while the plurality of touch sensors are configured to transmit touch scanning signals nearby.

13. The touch sensing display panel of claim 11, wherein the GOA circuit is configured to output respective gate scanning signals to drive the N numbers of gate-lines on the array substrate with the switch signal being provided with a low voltage level during a display scan stage before and after a touch scan stage, and to halt the gate scanning signals into respective N numbers of gate lines with the switch signal being switched from a low voltage level to a high voltage level for each shift register unit only during the touch scan stage while the plurality of touch sensors are configured to transmit touch scanning signals nearby.

14. A method of driving a shift register circuit of claim 1 as a unit of a GOA circuit for generating a plurality of gate scanning signals to a plurality of gate lines, the method comprising providing the switch signal at a low voltage level to the switch control port for outputting a gate scanning signal from the output port to one gate line of the plurality of gate lines during a display scan stage for image display.

15. The method of claim 14, during the display scan stage for image display, further comprising:

in a first period, inputting a high voltage level through the input port to turn on the first transistor to allow the VDD supply voltage to charge the first capacitor and pull up the pull-up node to a high voltage level under a condition that a low voltage level is provided to the first clock input port and the switch signal is provided with a low voltage level, wherein the high voltage level at the pull-up node pulls down the pull-down node to a low voltage level by turning on the sixth transistor with a source being provided with the low voltage level, the low voltage level at the pull-down node turns off the fifth transistor and the seventh transistor;

in a second period, keeping the switch signal at the low voltage level to maintain the ninth transistor and the tenth transistor in an OFF state and providing the first clock signal with a high voltage level for bootstrapping the pull-up node via the first capacitor to a voltage level higher than the high voltage level to keep the sixth transistor in an ON state and to output the high voltage level of the first clock signal as a gate scanning signal to the gate line; and in a third period, providing the reset signal with a high voltage level to pull down the pull-up node to the low voltage level to turn off the third transistor coupled to the output port to halt the gate scanning signal.

16. The method of claim 15, further comprising:

in a fourth period, inputting the second clock signal at a high voltage level to pass the high voltage level to the pull-down node to turn on the fifth transistor for releasing noises of the output port and turn on the seventh transistor for releasing noises of the pull-up node, the output port is set to a low voltage level, wherein the fourth period is substantially overlapped in time with the third period.

17. The method of claim 16, further comprising:

in a fifth period, providing the first clock signal with the high voltage level to keep the pull-down node at the high voltage level via the second capacitor to keep the fifth transistor and the seventh transistor in an ON state for releasing noises of the output port and the pull-up node, wherein the fifth period follows the fourth period in time, the fourth period and the fifth period alternatingly repeated until the display scan stage ends.

18. The method of claim 14, further comprising switching the switch signal to a high voltage level to halt output of the gate scanning signal only during a touch scan stage for touch sensing in a middle of the display scan stage; and switching the switch signal back to the low voltage level to resume the display scan stage for outputting the gate scanning signal to the one gate line.

19. The method of claim 18, during a display scan stage mixed with a touch scan stage comprising a touch period for transmitting the touch scanning signal near the one gate line, the method further comprising:

in a first period, inputting a high voltage level through the input port to turn on the first transistor to allow the VDD supply voltage to charge the first capacitor and pull up the pull-up node to a high voltage level under a condition that the first clock signal is provided with a low voltage level and the switch signal is provided with a low voltage level, wherein the high voltage level at the pull-up node pulls down the pull-down node to a low voltage level by turning on the sixth transistor with a source provided with a low voltage level, the low voltage level at the pull-down node turns off the fifth transistor and the seventh transistor;

in the touch period, switching the switch signal to a high voltage level to turn on the fourth transistor for releasing noises of the output port and halting the gate scanning signal with the first clock signal being kept at the low voltage level, wherein the pull-up node remains at the high voltage level to turn the ninth transistor and tenth transistor in an ON state to allow the high voltage level of the switch signal to continue charging the first capacitor and maintain the pull-up node at the high voltage level; and in a second period, switching the switch signal back to the low voltage level for rest of the display scan stage, providing the first clock signal with a high voltage level for bootstrapping the pull-up node via the first capacitor to a voltage level higher than the high voltage level to keep the sixth transistor in an ON state, and outputting the high voltage level of the first clock signal as the gate scanning signal into the gate line, wherein the switch signal at the low voltage level turns the ninth transistor and the tenth transistor to an OFF state, the pull-down node remains at the low voltage level to keep the fifth transistor and seventh transistor in an OFF state;

wherein the touch period follows behind the first period in time and is at least partially overlapped with the second period.

20. The method of claim 19, further comprising:

in a third period, providing the reset signal with a high voltage level to pull down the pull-up node to a low voltage level to turn off the third transistor coupled to the output port to cut off the gate scanning signal; and in a fourth period, inputting the second clock signal at a high voltage level to pass the high voltage level to the pull-down node to turn the fifth transistor in an ON state for releasing noise of the output port and turn the seventh transistor in an ON state for releasing noise of the pull-up node, the output port is set to a low voltage level, wherein the fourth period is substantially overlapped in time with the third period.

* * * * *